United States Patent
Gardner et al.

[11] Patent Number: 6,051,471
[45] Date of Patent: *Apr. 18, 2000

[54] METHOD FOR MAKING ASYMMETRICAL N-CHANNEL AND SYMMETRICAL P-CHANNEL DEVICES

[75] Inventors: Mark I. Gardner, Cedar Creek; Derick J. Wristers; H. Jim Fulford, Jr., both of Austin, all of Tex.

[73] Assignee: Advanced Micro Devices, Inc., Sunnyvale, Calif.

[*] Notice: This patent is subject to a terminal disclaimer.

[21] Appl. No.: 08/711,957

[22] Filed: Sep. 3, 1996

[51] Int. Cl.[7] .................................................. H01L 21/336

[52] U.S. Cl. .......................... 438/286; 438/305; 438/306; 438/307; 438/231; 438/232

[58] Field of Search .................................... 438/286, 305, 438/306, 307, 231, 232, FOR 204, FOR 188, FOR 190, FOR 175, FOR 216–FOR 218, FOR 168

[56] References Cited

U.S. PATENT DOCUMENTS

| | | | |
|---|---|---|---|
| 4,225,875 | 9/1980 | Ipri | 357/23 |
| 4,272,881 | 6/1981 | Angle | 29/571 |
| 4,927,777 | 5/1990 | Hsu et al. | 437/44 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61-194777 | 8/1986 | Japan . |
| 61-194777 | 1/1987 | Japan . |
| 1-18762 | 1/1992 | Japan . |
| 4-18762 | 1/1992 | Japan ................................... 257/408 |
| 08078672 | 3/1996 | Japan . |

OTHER PUBLICATIONS

IBM Technical Disclosure Bulletin, "Process for Making Very Small, Asymmetric, Field–Effect Transistors", vol. 30, No. 3, Aug. 1987, pp. 1136–1137 (XP 000671026).

IBM Technical Disclosure Bulletin, "Low Series Resistance Source by Spacer Methods", vol. 33, No. 1A, Jun. 1, 1990, pp. 75–77 (XP 000120044).

U.S. Patent Application, Serial No. 08/682,238, filed Jul. 17, 1996, entitled "Method For Fabrication Of A Non–Symmetrical Transistor", by Mark I. Gardner, Derick J. Wristers and H. Jim Fulford, Jr.

(List continued on next page.)

*Primary Examiner*—Wael M. Fahmy
*Assistant Examiner*—Long Pham
*Attorney, Agent, or Firm*—Skjerven, Morrill, MacPherson, Franklin & Friel, LLP

[57] ABSTRACT

An asymmetrical N-channel IGFET and a symmetrical P-channel IGFET are disclosed. The N-channel IGFET includes heavily doped and ultra-heavily doped source regions, and lightly doped and heavily doped drain regions. The P-channel IGFET includes lightly doped and heavily doped source and drain regions. Forming the N-channel IGFET includes forming a gate with first and second opposing sidewalls, applying a first ion implantation to implant lightly doped N-type source and drain regions, applying a second ion implantation to convert the lightly doped N-type source region into a heavily doped N-type source region without doping the lightly doped N-type drain region, forming first and second spacers adjacent to the first and second sidewalls, respectively, and applying a third ion implantation to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer. Advantageously, both IGFETs reduce hot carrier effects, and the N-channel IGFET has particularly low source-drain series resistance.

25 Claims, 5 Drawing Sheets

U.S. PATENT DOCUMENTS

| | | | |
|---|---|---|---|
| 5,073,514 | 12/1991 | Ito et al. | 437/44 |
| 5,132,753 | 7/1992 | Chang et al. | 357/23.4 |
| 5,171,700 | 12/1992 | Zamanian | 437/44 |
| 5,200,358 | 4/1993 | Bollinger et al. | 437/180 |
| 5,286,664 | 2/1994 | Horiuchi | 437/44 |
| 5,296,398 | 3/1994 | Noda | 437/44 |
| 5,349,225 | 9/1994 | Redwine et al. | 257/336 |
| 5,364,807 | 11/1994 | Hwang | 437/44 |
| 5,366,915 | 11/1994 | Kadama | 437/43 |
| 5,397,715 | 3/1995 | Miller | 437/27 |
| 5,424,229 | 6/1995 | Oyamatsu | 437/35 |
| 5,424,234 | 6/1995 | Kwon | 437/44 |
| 5,436,482 | 7/1995 | Ogoh | 257/344 |
| 5,451,807 | 9/1995 | Fujita | 257/404 |
| 5,510,279 | 4/1996 | Chien et al. | 437/41 |
| 5,512,503 | 4/1996 | Hong | 437/43 |
| 5,518,940 | 5/1996 | Hodate et al. | 437/41 |
| 5,521,417 | 5/1996 | Wada | 257/390 |
| 5,525,552 | 6/1996 | Huang | 437/41 |
| 5,547,885 | 8/1996 | Ogoh | 437/44 |
| 5,547,888 | 8/1996 | Yamazaki | 437/52 |
| 5,578,509 | 11/1996 | Fujita | 437/35 |
| 5,585,293 | 12/1996 | Sharma et al. | 437/43 |
| 5,585,658 | 12/1996 | Mukai et al. | 257/344 |
| 5,607,869 | 3/1997 | Yamazaki | 437/40 |
| 5,648,286 | 7/1997 | Gardner et al. | 437/44 |
| 5,654,215 | 8/1997 | Gardner et al. | 438/286 |
| 5,672,531 | 9/1997 | Gardner et al. | 437/44 |
| 5,677,224 | 10/1997 | Kadosh et al. | 437/57 |
| 5,759,897 | 6/1998 | Kadosh et al. | 438/286 |
| 5,789,787 | 8/1998 | Kadosh et al. | 257/369 |
| 5,849,622 | 12/1998 | Hause et al. | 438/286 |
| 5,872,761 | 10/1998 | Fulford, Jr. et al. | 438/199 |

OTHER PUBLICATIONS

U.S. Patent Application, Serial No. 08/682,493, filed Jul. 17, 1996, entitled "Method For Fabrication Of A Non–Symmetrical Transistor", by Mark I. Gardner, Michael P. Duane and Derick J. Wristers.

METHOD FOR MAKING ASYMMETRICAL N-CHANNEL AND SYMMETRICAL P-CHANNEL DEVICES

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the channel and the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and drain. Saturation drain current (i.e., drain current in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current.

Complementary metal-oxide semiconductor (CMOS) circuits typically include adjacent N-channel (NMOS) and P-channel (PMOS) devices. Since CMOS inverter circuits use very little power, CMOS is particularly useful in very large-scale integrated (VLSI) circuits where even small power dissipation in each transistor becomes a problem when thousands or millions of transistors are integrated on a chip. CMOS processes typically use N-well and P-well masks early in the processing sequence to define N-type and P-type active regions. CMOS processes also typically include a single masking step for forming gates over the active regions, separate masking steps for implanting lightly doped N-type source/drain regions into the P-type active region and lightly doped P-type source/drain regions into the N-type active region, formation of oxide spacers adjacent to the gates, and then separate masking steps for implanting heavily doped N-type source/drain regions into the P-type active region and heavily doped P-type source/drain regions into the N-type active region.

In certain complementary circuits, the required drive current of the N-channel device far exceeds that of the P-channel device. In such circuits, forming asymmetrical N-channel devices and symmetrical P-channel devices may represent the optimal tradeoff between device performance and fabrication complexity.

Accordingly, a need exists for improved asymmetrical N-channel and symmetrical P-channel IGFETs.

SUMMARY OF THE INVENTION

The present invention provides an asymmetrical N-channel IGFET and a symmetrical P-channel IGFET. The N-channel IGFET includes a lightly doped drain region, a heavily doped drain region, and an ultra-heavily doped source region. Preferably, the N-channel IGFET also includes a heavily doped source region, such that the heavily doped source region and the lightly doped drain region provide channel junctions. Preferably, the P-channel IGFET includes lightly doped and heavily doped source and drain regions, and the lightly doped source and drain regions provide channel junctions. Advantageously, both IGFETs reduce hot carrier effects, the N-channel IGFET has particularly low source-drain series resistance, and the additional processing steps needed to fabricate an asymmetric P-channel IGFET are avoided. Thus, the invention is particularly well-suited for circuits which demand higher drive current from the N-channel devices than from the P-channel devices.

By definition, the dopant concentration of the ultra-heavily doped source region exceeds that of the heavily doped source and drain regions, and the dopant concentration of the heavily doped source and drain regions exceeds that of the lightly doped drain region. Furthermore, the heavily doped source and drain regions need not have similar dopant concentrations.

Preferably, the N-channel IGFET includes a source that consists of heavily doped and ultra-heavily doped source regions, the P-channel IGFET includes a source that consists of lightly doped and heavily doped source regions, and both the N-channel and P-channel IGFETs include drains that consist of lightly doped and heavily doped drain regions. It is also preferred that the dopant concentration of the ultra-heavily doped source region is in the range of 1.5 to 10 times that of the heavily doped source and drain regions, and the dopant concentration of the heavily doped source and drain regions is in the range of 10 to 100 times that of the lightly doped drain regions, and furthermore that the dopant concentration of the lightly doped drain regions is in the range of about $1 \times 10^{17}$ to $5 \times 10^{18}$ atoms/cm$^3$, the dopant concentration of the heavily doped source and drain regions is in the range of about $1 \times 10^{19}$ to $1 \times 10^{20}$ atoms/cm$^3$, and the dopant concentration of the ultra-heavily doped source regions is in the range of about $1.5 \times 10^{19}$ to $1 \times 10^{21}$ atoms/cm$^3$.

In accordance with an aspect of the invention, a method of making asymmetrical N-channel and P-channel IGFETs includes providing a semiconductor substrate with an N-type active region and a P-type active region adjacent to an isolation region.

Forming the N-channel IGFET includes forming a first gate with first and second opposing sidewalls over the P-type active region, applying a first ion implantation of an N-type dopant to implant lightly doped N-type source and drain regions into the P-type active region, applying a second ion implantation of an N-type dopant to convert substantially all of the lightly doped N-type source region into a heavily doped N-type source region without doping the lightly doped N-type drain region, forming first and second spacers adjacent to the first and second sidewalls, respectively, and applying a third ion implantation of an N-type dopant to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer. An N-type source in the P-type active region includes the heavily doped and ultra-heavily doped N-type source regions, and an N-type drain in the P-type active region includes the lightly doped and heavily doped N-type drain regions.

Forming the P-channel IGFET includes forming a second gate with third and fourth opposing sidewalls over the N-type active region, applying a first ion implantation of a P-type dopant to implant lightly doped P-type source and drain regions into the N-type active region, forming third and fourth spacers adjacent to the third and fourth sidewalls, respectively, and applying a second ion implantation of a P-type dopant to convert a portion of the lightly doped P-type source region outside the third spacer into a heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer. A P-type source in the N-type active region includes the lightly doped and heavily doped P-type source regions, and a P-type drain in the N-type active region includes the lightly doped and heavily doped P-type drain regions Another aspect of the method includes forming the first and second gates, forming a first photoresist layer that covers the N-type active region, applying the first ion implantation of an N-type dopant using the first photoresist layer and the first gate as an implant mask, forming a second photoresist layer that covers the N-type active region and the lightly doped N-type drain region, applying the second ion implantation of an N-type dopant using the second photoresist layer and a portion of the first gate as an implant mask, forming a third photoresist layer that covers the P-type active region, applying the first ion implantation of a P-type dopant using the third photoresist layer and the second gate as an implant mask, forming the spacers, forming a fourth photoresist layer that covers the N-type active region, applying the third ion implantation of an N-type dopant using the fourth photoresist layer and the first gate and the first and second spacers as an implant mask, forming a fifth photoresist layer that covers the P-type active region, and applying the second ion implantation of a P-type dopant using the fifth photoresist layer and the second gate and the third and fourth spacers as an implant mask.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
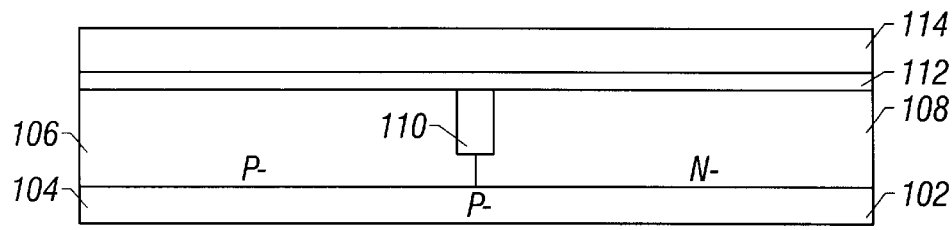
FIGS. 1A–1R show cross-sectional views of successive process steps for making an asymmetrical N-channel IGFET and a symmetrical P-channel IGFET in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes P-type epitaxial layer 104. Preferably, epitaxial layer 104 is disposed on a P+ base layer (not shown). Substrate 102 also includes P− active region 106 and N− active region 108 adjacent to a planar top surface. Active region 106 has a boron background concentration on the order of $1 \times 10^{16}$ atoms/cm$^3$, a <100> orientation and a resistivity of 12 ohm-cm, and active region 108 has an arsenic background concentration on the order of $1 \times 10^{16}$ atoms/cm$^3$, a <100> orientation and a resistivity of 12 ohm-cm. Trench oxide 110, composed of silicon dioxide (SiO$_2$), provides dielectric isolation between active regions 106 and 108. Gate oxide 112, composed of silicon dioxide (SiO$_2$), is formed on the top surface of substrate 102 using tube growth at a temperature of 700 to 1000° C. in an O$_2$ containing ambient. Gate oxide 112 has a thickness of 50 angstroms. Thereafter, a blanket layer of undoped polysilicon 114 is deposited by low pressure chemical vapor deposition (LPCVD) on the top surface of gate oxide 112. Polysilicon 114 has a thickness of 2000 angstroms. If desired, polysilicon 114 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 114 be doped during an implantation step following a subsequent etch step.

Figure 1B:
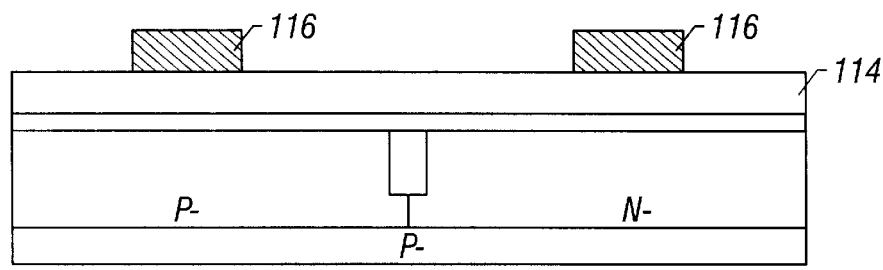

In FIG. 1B, photoresist 116 is deposited as a continuous layer on polysilicon 114 and selectively irradiated using a photolithographic system, such as a step and repeat optical projection system, in which I-line ultraviolet light from a mercury-vapor lamp is projected through a first reticle. Thereafter, photoresist 116 is developed and the irradiated portions are removed to provide openings in photoresist 116. The openings expose portions of polysilicon 114, thereby defining first and second gates.

Figure 1C:
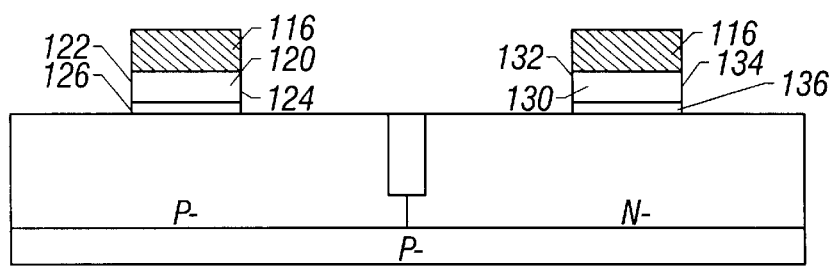

In FIG. 1C, an anisotropic etch is applied that removes the exposed portions of polysilicon 114 and the underlying portions of gate oxide 112. Preferably, a first dry etch is applied that is highly selective of polysilicon, and a second dry etch is applied that is highly selective of silicon dioxide, using photoresist 116 as an etch mask. After etching occurs, the remaining portions of polysilicon 114 and gate oxide 112 above active region 106 provide polysilicon gate 120 with opposing vertical sidewalls 122 and 124 on gate oxide 126, and polysilicon gate 130 with opposing vertical sidewalls 132 and 134 on gate oxide 136. Polysilicon gate 120 has a length (between sidewalls 122 and 124) of 3500 angstroms, and polysilicon gate 130 has a length (between sidewalls 132 and 134) of 3500 angstroms.

Figure 1D:
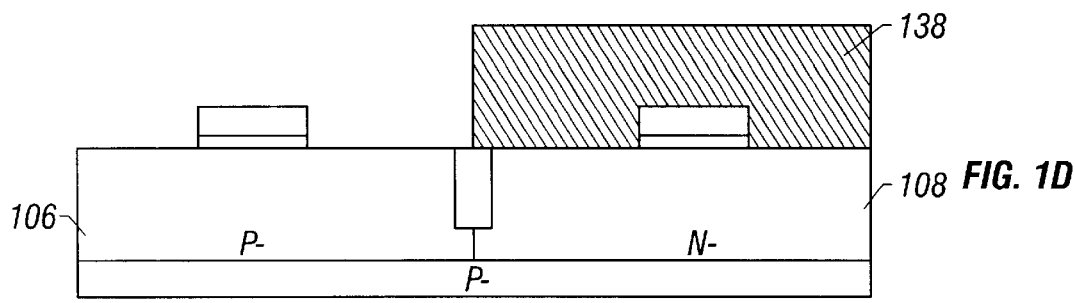

In FIG. 1D, photoresist 116 is stripped, photoresist 138 is deposited as a continuous layer over substrate 102 and selectively irradiated using the photolithographic system and a second reticle, and the irradiated portions are removed to provide an opening in photoresist 138. The opening is above active region 106, and photoresist 138 covers active region 108.

Figure 1E:
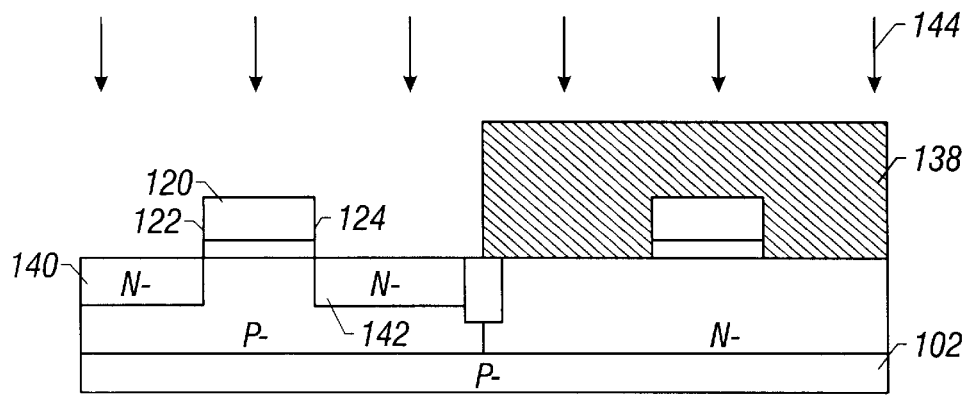

In FIG. 1E, lightly doped source and drain regions 140 and 142 are implanted into active region 106 by subjecting the structure to ion implantation of phosphorus, indicated by arrows 144, at a dose in the range of $1 \times 10^{13}$ to $5 \times 10^{14}$ atoms/cm$^2$ and an energy in the range of 2 to 35 kiloelectron-volts. Polysilicon gate 120 and photoresist 138 provide an implant mask for the underlying portion of substrate 102. As a result, lightly doped source and drain regions 140 and 142 are substantially aligned with sidewalls 122 and 124, respectively. Lightly doped source and drain regions 140 and 142 are doped N− with a phosphorus concentration in the range of about $1 \times 10^{17}$ to $5 \times 10^{18}$ atoms/cm$^3$.

Figure 1F:
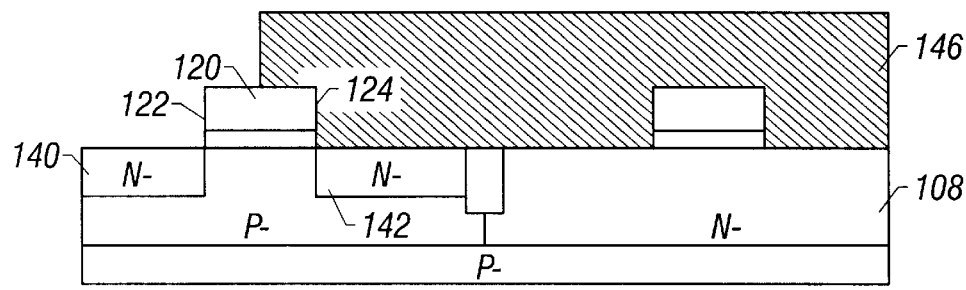

In FIG. 1F, photoresist 138 is stripped, photoresist 146 is deposited as a continuous layer over substrate 102 and selectively irradiated using the photolithographic system and a third reticle, and the irradiated portions are removed to provide an opening in photoresist 146. The opening is above lightly doped source region 140, and a first portion of polysilicon gate 120 adjacent to sidewall 122. Photoresist 146 covers lightly doped drain region 142, a second portion of polysilicon gate 120 adjacent to sidewall 124, and active region 108.

Figure 1G:
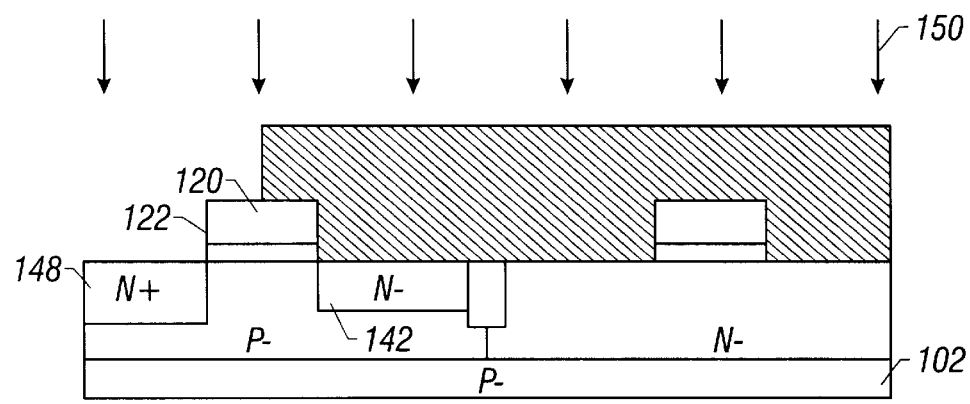

In FIG. 1G, lightly doped source region 140 is converted into heavily doped source region 148 by subjecting the structure to ion implantation of arsenic, indicated by arrows 150, at a dose of $4.5 \times 10^{15}$ atoms/cm$^2$ and an energy in the range of 10 to 80 kiloelectron-volts. Photoresist 146 and the first portion of polysilicon gate 120 (outside photoresist 146) provide an implant mask for the underlying portion of substrate 102. As a result, heavily doped source region 148 is substantially aligned with sidewall 122, and lightly doped drain region 142 is essentially unaffected. Heavily doped source region 148 is doped N+ with an arsenic concentration in the range of about $1 \times 10^{19}$ to $1 \times 10^{20}$ atoms/cm$^3$. Preferably, the dopant concentration of heavily doped source region 148 is at least 10 times that of lightly doped drain region 142.

Figure 1H:
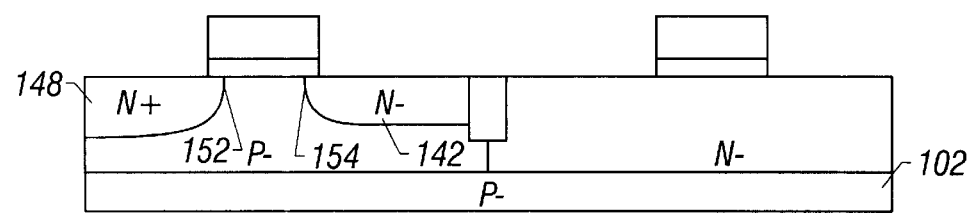

In FIG. 1H, photoresist 146 is stripped, and a first tube anneal is applied to remove crystalline damage and to drive-in and activate heavily doped source region 148 and lightly doped drain region 142. Preferably, the first tube anneal is ramped up from room temperature at about 10° C. per minute, maintained at a maximum temperature of 825 to 875° C. for 30 to 75 minutes, and then ramped down to room temperature at about 5° C. per minute. More preferably, the first tube anneal is maintained at a maximum temperature of 850° C. for 60 minutes. As a result, heavily doped source region 148 diffuses a controlled amount into substrate 102 and provides first channel junction 152 beneath polysilicon gate 120, and lightly doped drain region 142 diffuses a controlled amount into substrate 102 and provides second channel junction 154 beneath polysilicon gate 120.

Figure 1I:
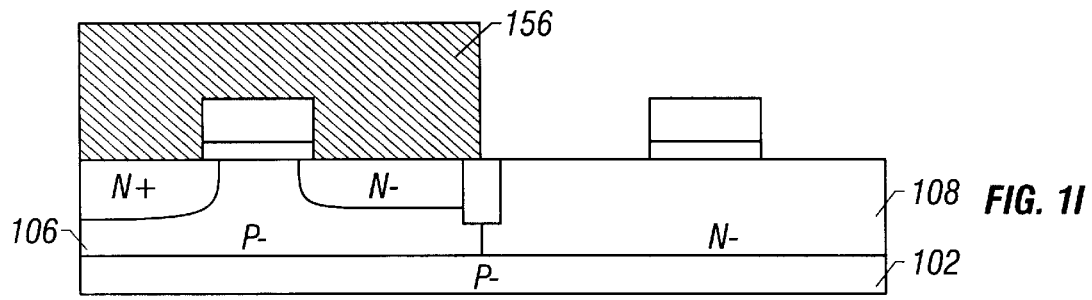

In FIG. 1I, photoresist 156 is deposited as a continuous layer over substrate 102 and selectively irradiated using the photolithographic system and a fourth reticle, and the irradiated portions are removed to provide an opening in photoresist 156. The opening is above active region 108, and photoresist 156 covers active region 106.

Figure 1J:
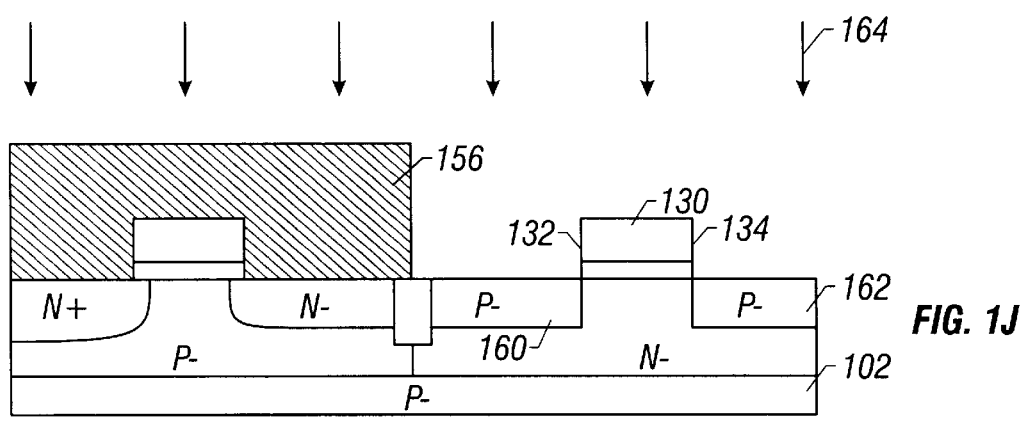

In FIG. 1J, lightly doped source and drain regions 160 and 162 are implanted into active region 108 by subjecting the structure to ion implantation of boron difluoride (BF$_2$), indicated by arrows 164, at a dose in the range of $1 \times 10^{13}$ to $5 \times 10^{14}$ atoms/cm$^2$ and an energy in the range of 2 to 35 kiloelectron-volts. Polysilicon gate 130 and photoresist 156 provide an implant mask for the underlying portion of substrate 102. As a result, lightly doped source and drain regions 160 and 162 are substantially aligned with sidewalls 132 and 134, respectively. Lightly doped source and drain regions 160 and 162 are doped P− with a boron concentration in the range of about $1 \times 10^{17}$ to $5 \times 10^{18}$ atoms/cm$^3$.

Figure 1K:
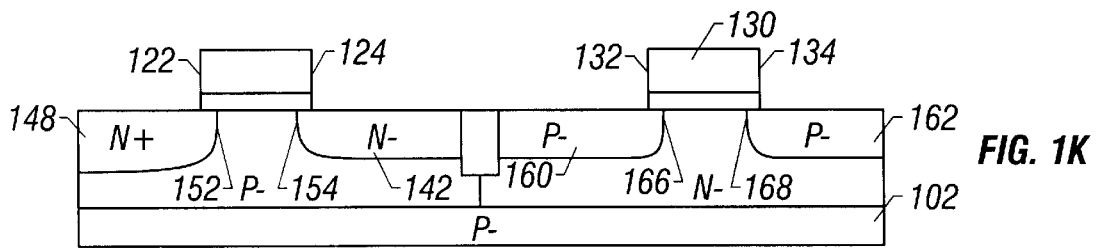

In FIG. 1K, photoresist 156 is stripped, and a second tube anneal is applied to remove crystalline damage and to drive-in and activate lightly doped source and drain regions 160 and 162. Preferably, the second tube anneal is ramped up from room temperature at about 10° C. per minute, maintained at a maximum temperature in the range of 775 to 825° C. for 30 to 75 minutes, and then ramped down to room temperature at about 5° C. per minute. More preferably, the second tube anneal is maintained at a maximum temperature of 800° C. for 60 minutes. It is also preferred that the second tube anneal have a maximum temperature that is 25 to 75° C. less than that of the first tube anneal. Accordingly, lightly doped source and drain regions 160 and 162 diffuse a controlled amount into substrate 102 and provide third and fourth channel junctions 166 and 168, respectively, beneath polysilicon gate 130. The second tube anneal also diffuses heavily doped source region 148 and lightly doped drain region 142 slightly further into substrate 102. After the first and second tube anneals, channel junction 152 laterally extends about 600 angstroms past sidewall 122, channel junction 154 laterally extends about 600 angstroms past sidewall 124, channel junction 166 laterally extends about 600 angstroms past sidewall 132, and channel junction 168 laterally extends about 600 angstroms past sidewall 134.

Figure 1L:
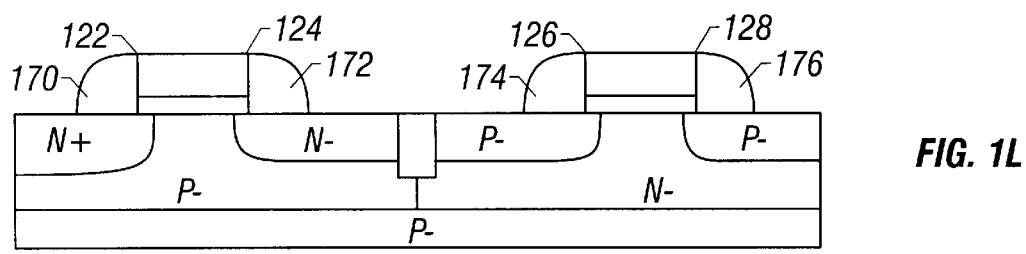

In FIG. 1L, a blanket layer of silicon dioxide with a thickness of 2500 angstroms is conformally deposited over the exposed surfaces by CVD at a temperature in the range of 300 to 400° C. Thereafter, the structure is subjected to an anisotropic etch, such as a reactive ion etch, that forms oxide spacers 170, 172, 174 and 176 adjacent to sidewalls 122, 124, 132 and 134, respectively. Oxide spacers 170, 172, 174 and 176 each extend 1200 angstroms across substrate 102.

Figure 1M:
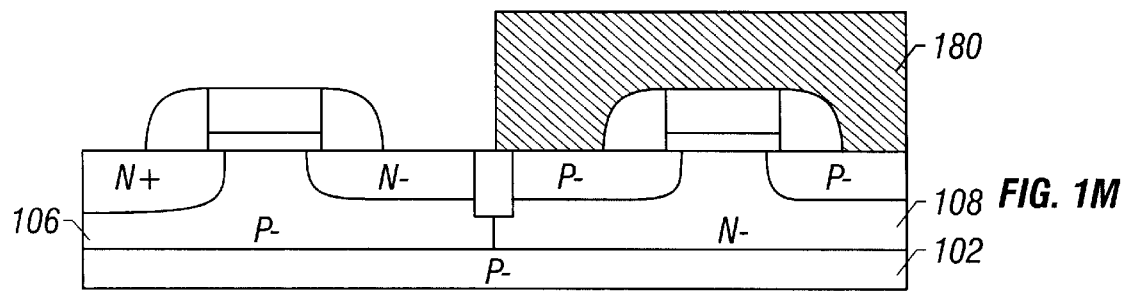

In FIG. 1M, photoresist 180 is deposited as a continuous layer over substrate 102 and selectively irradiated using the photolithographic system and the second reticle, and the irradiated portions are removed to provide an opening in photoresist 180. The opening is above active region 106, and photoresist 180 covers active region 108.

Figure 1N:
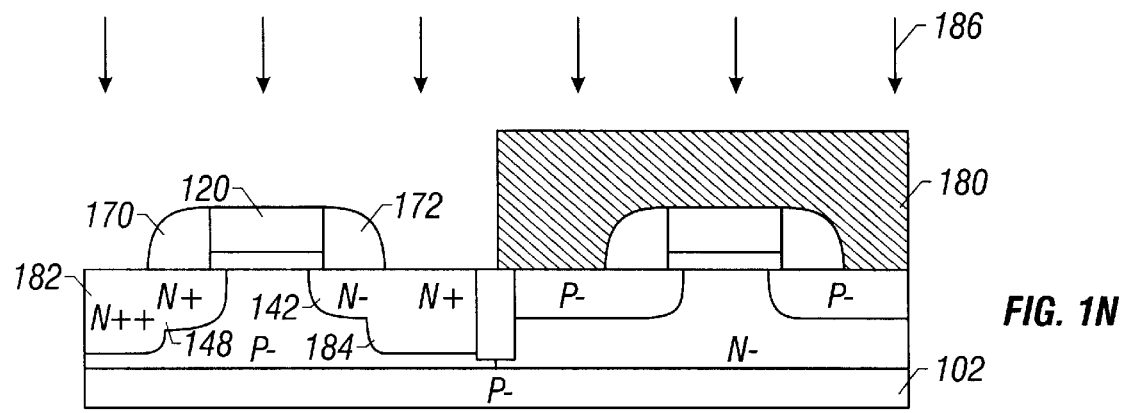

In FIG. 1N, a portion of heavily doped source region 148 outside oxide spacer 170 is converted into ultra-heavily doped source region 182, and a portion of lightly doped drain region 142 outside oxide spacer 172 is converted into heavily doped drain region 184 by subjecting the structure to ion implantation of arsenic, indicated by arrows 186, at a dose in the range of $2 \times 10^{15}$ to $3 \times 10^{15}$ atoms/cm$^2$ and an energy in the range of 20 to 80 kiloelectron-volts. Polysilicon gate 120, oxide spacers 170 and 172, and photoresist 180 provide an implant mask for the underlying portion of substrate 102. As a result, ultra-heavily doped source region 182 is substantially aligned with oxide spacer 170 on the side opposite polysilicon gate 120, and heavily doped drain region 184 is substantially aligned with oxide spacer 172 on the side opposite polysilicon gate 120. Furthermore, the portion of heavily doped source region 148 beneath oxide spacer 170 and the portion of lightly doped drain region 142 beneath oxide spacer 172 are essentially unaffected. Ultra-heavily doped source region 182 is doped N++ with an arsenic concentration in the range of about $1.5 \times 10^{19}$ to $1 \times 10^{21}$ atoms/cm$^3$, and heavily doped drain region 184 is doped N+ with an arsenic concentration in the range of about $1 \times 10^{19}$ to $1 \times 10^{20}$ atoms/cm$^3$. Preferably, the dopant concentration of ultra-heavily doped source region 182 is at least 1.5 times that of heavily doped source region 148 and heavily doped drain region 184.

Figure 1O:
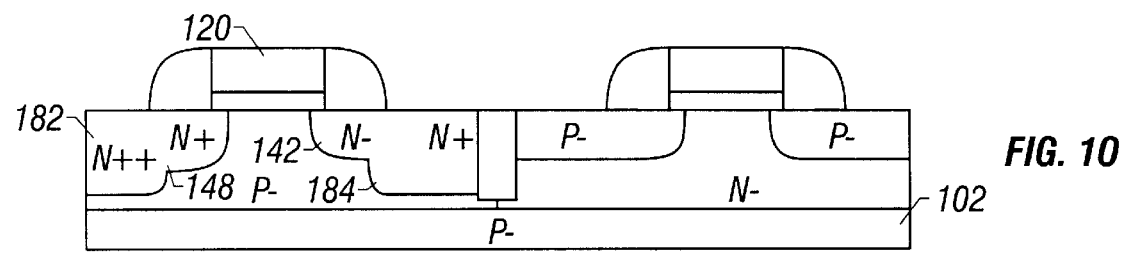

In FIG. 1O, photoresist 180 is stripped, and a first rapid thermal anneal is applied to remove crystalline damage and to drive-in and activate the implanted arsenic from the previous ion implantation. Preferably, the first rapid thermal anneal is on the order of 950 to 1050° C. for 10 to 60 seconds, and more preferably 1050° C. for 30 seconds. As a result, heavily doped source region 148 and ultra-heavily doped source region 182 merge to form a source, and lightly doped drain region 142 and heavily doped drain region 184 merge to form a drain for an NMOS device controlled by polysilicon gate 120. The first rapid thermal anneal also diffuses all of the implanted regions slightly further into substrate 102.

Figure 1P:
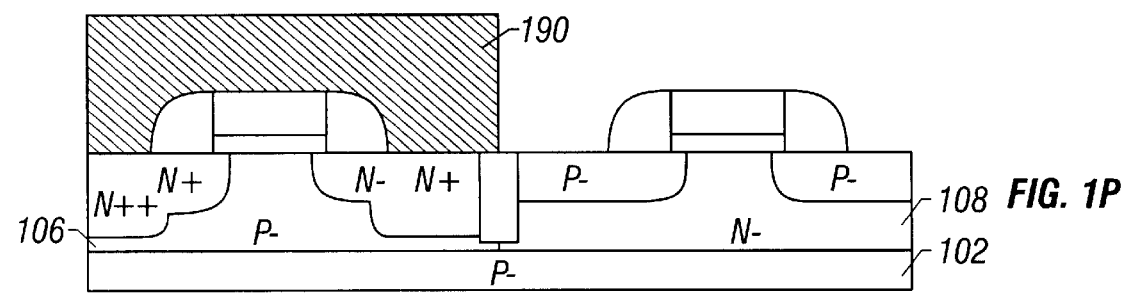

In FIG. 1P, photoresist 190 is deposited as a continuous layer over substrate 102 and selectively irradiated using the photolithographic system and the fourth reticle, and the irradiated portions are removed to provide an opening in photoresist 190. The opening is above active region 108, and photoresist 190 covers active region 106.

Figure 1Q:
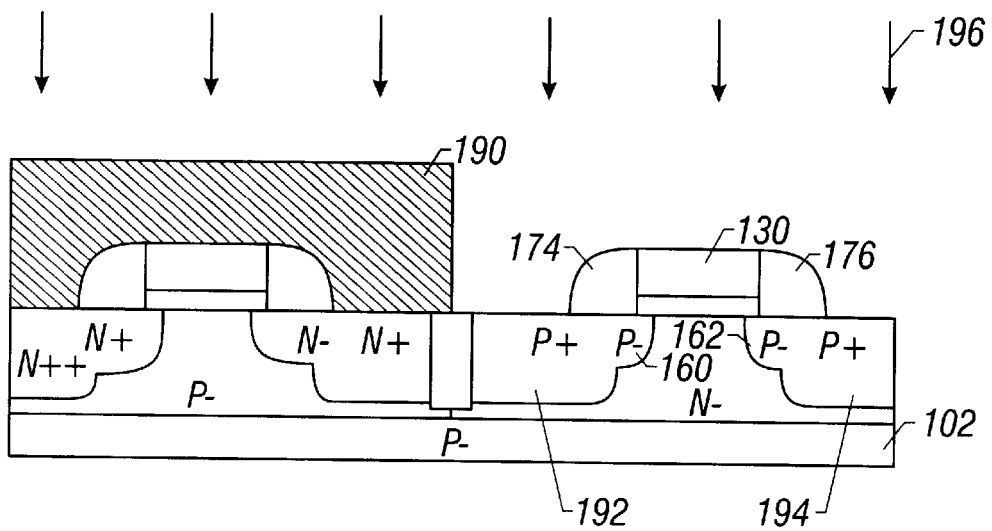

In FIG. 1Q, a portion of lightly doped source region 160 outside oxide spacer 174 is converted into heavily doped source region 192, and a portion of lightly doped drain region 162 outside oxide spacer 178 is converted into heavily doped drain region 194 by subjecting the structure to ion implantation of boron difluoride, indicated by arrows 196, at a dose in the range of $2 \times 10^{15}$ to $3 \times 10^{15}$ atoms/cm$^2$ and an energy in the range of 20 to 80 kiloelectron-volts. Polysilicon gate 130, oxide spacers 174 and 176, and photoresist 190 provide an implant mask for the underlying portion of substrate 102. As a result, heavily doped source region 192 is substantially aligned with oxide spacer 174 on the side opposite polysilicon gate 130, and heavily doped drain region 194 is substantially aligned with oxide spacer 176 on the side opposite polysilicon gate 130. Furthermore, the portion of lightly doped source region 160 beneath oxide spacer 174 and the portion of lightly doped drain region 162 beneath oxide spacer 176 are essentially unaffected. Heavily doped source and drain regions 192 and 194 are doped P+ with a boron concentration in the range of about $1 \times 10^{19}$ to $1 \times 10^{20}$ atoms/cm$^3$. Preferably, the dopant concentration of heavily doped source and drain regions 192 and 194 is at least 10 times that of lightly doped source and drain regions 160 and 162.

Figure 1R:
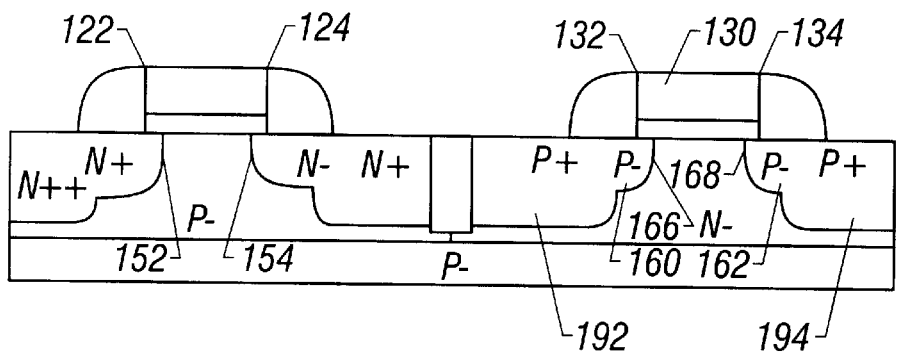

In FIG. 1R, photoresist 194 is stripped, and a second rapid thermal is applied to remove crystalline damage and to drive-in and activate the implanted boron from the previous ion implantation. Preferably, the second rapid thermal anneal is on the order of 800 to 1000° C. for 10 to 60 seconds, and more preferably 1000° C. for 30 seconds. It is also preferred that the second rapid thermal anneal have a temperature that is 50 to 100° C. less than that of the first rapid thermal anneal. Accordingly, lightly doped source region 160 and heavily doped source region 192 merge to form a source, and lightly doped drain region 162 and heavily doped drain region 194 merge to form a drain for a PMOS device controlled by polysilicon gate 130. The second rapid thermal anneal also diffuses all of the implanted regions slightly further into substrate 102. After the first and second rapid thermal anneals, channel junction 152 laterally extends about 850 angstroms past sidewall 122, channel junction 154 laterally extends about 850 angstroms past sidewall 124, channel junction 166 laterally extends about 850 angstroms past sidewall 132, and channel junction 168 laterally extends about 850 angstroms past sidewall 134. Thus, channel junctions 152 and 154 provide an effective channel length of about 1800 angstroms, and channel junctions 166 and 168 provide an effective channel length of about 1800 angstroms.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the interconnect metallization. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above.

For instance, the gate insulators can remain outside the gates during the ion implantations. The N-type source may include a very small lightly doped N-type source region adjacent to the channel junction as long as the lightly doped N-type source region, if any, is far smaller than the lightly doped N-type drain region. If desired, the first spacer can be removed so that substantially all of the heavily doped N-type source region is converted into the ultra-heavily doped N-type source region. The spacers may include several layers of sequentially grown or deposited materials, of which only one layer need be subjected to the anisotropic etch. The gate can be various conductors, and the gate insulators and spacers and can be various dielectrics including silicon dioxide, silicon nitride and silicon oxynitride. The P-channel IGFET need not include lightly doped regions. Suitable N-type dopants include arsenic, phosphorus and combinations thereof, suitable P-type dopants include boron, boron species (such as boron difluoride) and combinations thereof.

Further details regarding asymmetrical IGFETs are disclosed in U.S. application Ser. No. 08/711,383, attorney docket no. M-4289, filed concurrently herewith, entitled "Asymmetrical Transistor With Lightly Doped Drain Region, Heavily Doped Source and Drain Regions, and Ultra-Heavily Doped Source Region" by Gardner et al. now U.S. Pat. No. 5,648,286; U.S. application Ser. No. 08/711,382, attorney docket no. M-4215, filed concurrently herewith, entitled "Asymmetrical Transistor With Lightly and Heavily Doped Drain Regions and Ultra-Heavily Doped Source Region" by Kadosh et al. now U.S. Pat. No. 5,759,897; and U.S. application Ser. No. 08/711,381, attorney docket no. M-4228, filed concurrently herewith, entitled "Asymmetrical N-Channel and P-Channel Devices" by Kadosh et al. now U.S. Pat. No. 5,677,224; the disclosures of which are incorporated herein by reference.

The invention is particularly well-suited for fabricating N-channel MOSFETs, P-channel MOSFETs, and other types of IGFETs, as well as CMOS structures such as inverter circuits, particularly for high-performance microprocessors where high circuit density is essential. Although only a single pair of N-channel and P-channel devices has been shown for purposes of illustration, it is understood that in actual practice, many devices are fabricated on a single semiconductor wafer as widely practiced in the art. Accordingly, the invention is well-suited for use in integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an asymmetrical N-channel IGFET and a symmetrical P-channel IGFET, comprising the steps of:

providing a semiconductor substrate with a P-type active region and an N-Type active region;

forming an asymmetrical N-channel IGFET, including:
 forming a first gate with first and second opposing sidewalls over the P-type active region;
 forming an N-type source in the P-type active region, wherein the N-type source includes a ultra-heavily doped N-type source region; and
 forming an N-type drain in the P-type active region, wherein the P-type drain includes lightly doped and heavily doped N-type drain regions; and forming a symmetrical P-type IGFET, including:
 forming a second gate with third and fourth opposing sidewalls over the N-type active region;
 forming a P-type source in the N-type active region; and
 forming a P-type drain in the N-type active region.

2. The method of claim 1, wherein the N-type source consists of the ultra-heavily doped N-type source region.

3. The method of claim 1, wherein:

the N-type source includes a heavily doped N-type source region adjacent to the ultra-heavily doped N-type source region;

the N-type source provides a first channel junction; and the lightly doped N-type drain region provides a second channel junction.

4. The method of claim 3, wherein:

the N-type source consists of the heavily doped and ultra-heavily doped N-type source regions; and the N-type drain consists of the lightly and heavily doped N-type drain regions.

5. The method of claim 4, wherein:

the P-type source consists of a lightly doped P-type source region adjacent to a heavily doped P-type source region; and the P-type drain consists of a lightly doped P-type drain region adjacent to a heavily doped P-type drain region.

6. A method of making an asymmetrical N-channel IGFET and a symmetrical P-channel IGFET, comprising the steps of:

providing a semiconductor substrate with a P-type active region and an N-type active region;

forming an asymmetrical N-channel IGFET, including:
 forming a first gate with first and second opposing sidewalls over the P-type active region;
 applying a first ion implantation of an N-type dopant to implant lightly doped N-type source and drain regions into the P-type active region;
 applying a second ion implantation of an N-type dopant to convert substantially all of the lightly doped N-type source region into a heavily doped N-type source region without doping the lightly doped N-type drain region;
 forming first and second spacers adjacent to the first and second sidewalls, respectively;

applying a third ion implantation of an N-type dopant to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer; and forming an N-type source and drain in the P-type region, wherein the N-type source includes the heavily doped and ultra-heavily doped N-type source regions, and the N-type drain includes the lightly doped and heavily doped N-type drain regions; and forming a symmetrical P-type IGFET, including:
forming a second gate with third and fourth opposing sidewalls over the N-type active region;
forming a P-type source in the N-type active region; and
forming a P-type drain in the N-type active region.

7. The method of claim 6, wherein the N-type source consists of the heavily doped and ultra-heavily doped N-type source regions, and the N-type drain consists of the lightly doped and heavily doped N-type drain regions.

8. The method of claim 7, wherein the heavily doped and ultra-heavily doped N-type source regions and the lightly doped and heavily doped N-type drain regions extend to a top surface of the substrate.

9. The method of claim 7, wherein:
a dopant concentration of the heavily doped N-type source and drain regions is at least 10 times that of the lightly doped N-type drain region; and
a dopant concentration of the ultra-heavily doped N-type source region is at least 1.5 times that of the heavily doped N-type source and drain regions.

10. The method of claim 9, wherein:
the dopant concentration of the lightly doped N-type drain region is in the range of about $1 \times 10^{17}$ to $5 \times 10^{18}$ atoms/cm$^3$;
the dopant concentration of the heavily doped N-type source and drain regions is in the range of about $1 \times 10^{19}$ to $1 \times 10^{20}$ atoms/cm$^3$; and
the dopant concentration of the ultra-heavily doped N-type source region is in the range of about $1.5 \times 10^{19}$ to $1 \times 10^{21}$ atoms/cm$^3$.

11. The method of claim 6, including applying the first ion implantation of an N-type dopant using the first gate as an implant mask.

12. The method of claim 6, including:
forming a masking layer over the substrate after applying the first ion implantation of an N-type dopant, wherein the masking layer includes an opening above the lightly doped N-type source region and the first sidewall and a first portion of the first gate, and the masking layer covers the lightly doped N-type drain region and the second sidewall and a second portion of the first gate; and
applying the second ion implantation of an N-type dopant using the masking layer and the first portion of the first gate as an implant mask.

13. The method of claim 6, including applying the third ion implantation of an N-type dopant using the first gate and the first and second spacers as an implant mask.

14. The method of claim 6, wherein forming the P-type IGFET includes:

applying a first ion implantation of a P-type dopant to implant lightly doped P-type source and drain regions into the N-type active region;

forming third and fourth spacers adjacent to the third and fourth sidewalls, respectively; and applying a second ion implantation of a P-type dopant to convert a portion of the lightly doped P-type source region outside the third spacer into a heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer;

wherein the P-type source includes the lightly doped and heavily doped P-type source regions, and the P-type drain includes the lightly doped and heavily doped P-type drain regions.

15. The method of claim 14, including, in sequence:
forming the first and second gates;
applying the first ion implantation of an N-type dopant;
applying the second ion implantation of an N-type dopant;
applying the first ion implantation of a P-type dopant;
applying the third ion implantation of an N-type dopant; and
applying the second ion implantation of a P-type dopant.

16. The method of claim 15, wherein forming the first, second, third and fourth spacers includes depositing a blanket layer of insulative spacer material over the substrate, and then applying an anisotropic etch.

17. The method of claim 16, including:
forming a first photoresist layer to protect the N-type active region from the first ion implantation of an N-type dopant;
forming a second photoresist layer to protect the N-type active region and the lightly doped N-type drain region from the second ion implantation of an N-type dopant;
forming a third photoresist layer to protect the P-type active region from the first ion implantation of a P-type dopant;
forming a fourth photoresist layer to protect the N-type active region from the third ion implantation of an N-type dopant; and
forming a fifth photoresist layer to protect the P-type active region from the second ion implantation of a P-type dopant.

18. The method of claim 6, wherein the N-channel IGFET and the P-channel IGFET are electrically coupled to one another.

19. The method of claim 18, wherein the N-channel IGFET and the P-channel IGFET provide an inverter circuit.

20. A method of making an asymmetrical N-channel IGFET and a symmetrical P-channel IGFET, comprising the steps of:
providing a semiconductor substrate with a P-type active region and an N-type active region;
forming a first gate insulator on the P-type active region;
forming a second gate insulator on the N-type active region;
forming a first gate with first and second opposing sidewalls on the first gate insulator;
forming a second gate with third and fourth opposing sidewalls on the second gate insulator;

applying a first ion implantation of an N-type dopant to form lightly doped N-type source and drain regions in the P-type active region and substantially aligned with the first and second sidewalls, respectively;

applying a second ion implantation of an N-type dopant to convert substantially all of the lightly doped N-type source region into a heavily doped N-type source region without doping the lightly doped N-type drain region;

applying a first ion implantation of a P-type dopant to form lightly doped P-type source and drain regions in the N-type active region and substantially aligned with the third and fourth sidewalls, respectively;

forming first, second, third and fourth spacers adjacent to the first, second, third and fourth sidewalls, respectively;

applying a third ion implantation of an N-type dopant to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer;

applying a second ion implantation of a P-type dopant to convert a portion of the lightly doped P-type source region outside the third spacer into a first heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer;

forming an N-type source and drain in the P-type active region, wherein the N-type source includes the heavily doped and ultra-heavily doped N-type source regions, and the N-type drain includes the lightly doped and heavily doped N-type drain regions; and forming a P-type source and drain in the N-type active region, wherein the P-type source includes the lightly doped and heavily doped P-type source regions, and the P-type drain includes the lightly doped and heavily doped P-type drain regions.

21. The method of claim 20, including, in sequence:

forming the first and second gates;

applying the first ion implantation of an N-type dopant;

applying the second ion implantation of an N-type dopant;

applying the first ion implantation of the P-type dopant;

forming the first, second, third and fourth spacers;

applying the third ion implantation of an N-type dopant; and applying the second ion implantation of a P-type dopant.

22. The method of claim 20, wherein forming the first, second, third and fourth spacers includes depositing a blanket layer of silicon dioxide over the substrate, and then applying a reactive ion etch.

23. The method of claim 20, wherein:

the N-type source and drain are doped with a dopant selected from the group consisting of arsenic, phosphorus, and combinations thereof; and the P-type source and drain are doped with a dopant selected from the group consisting of boron, boron species and combinations thereof.

24. The method of claim 20, wherein the first and second gates are polysilicon, the first and second gate insulators are silicon dioxide, and the spacers are silicon dioxide.

25. A method of making an asymmetrical N-channel IGFET and a symmetrical P-channel IGFET, comprising the steps of:

providing a semiconductor substrate with a P-type active region and an N-type active region adjacent to an isolation region;

forming a first gate oxide on the P-type active region;

forming a second gate oxide on the N-type active region;

forming a first polysilicon gate with first and second opposing sidewalls on the first gate oxide;

forming a second polysilicon gate with third and fourth opposing sidewalls on the second gate oxide;

forming a first photoresist layer over the substrate, wherein the first photoresist layer includes an opening above the P-type active region and the first photoresist layer covers the N-type active region;

applying a first ion implantation of an N-type dopant using the first photoresist layer and the first polysilicon gate as an implant mask to form lightly doped N-type source and drain regions in the P-type active region and substantially aligned with the first and second sidewalls, respectively;

stripping the first photoresist layer;

forming a second photoresist layer over the substrate, wherein the second photoresist layer includes an opening above the lightly doped N-type source region and the first sidewall and the second photoresist layer covers the second sidewall and the lightly doped N-type drain region and the N-type active region;

applying a second ion implantation of an N-type dopant using the second photoresist layer and a portion of the first polysilicon gate as an implant mask to convert substantially all of the lightly doped N-type source region into a heavily doped N-type source region without doping the lightly doped N-type drain region;

stripping the second photoresist layer;

forming a third photoresist layer over the substrate, wherein the third photoresist layer includes an opening above the N-type active region and the third photoresist layer covers the P-type active region;

applying a first ion implantation of a P-type dopant using the third photoresist layer and the second polysilicon gate as an implant mask to form lightly doped P-type source and drain regions in the N-type active region and substantially aligned with the third and fourth sidewalls, respectively;

stripping the third photoresist layer;

depositing a blanket layer of spacer material over the substrate and then applying an anisotropic etch to form first, second, third and fourth spacers adjacent to the first, second, third and fourth sidewalls, respectively;

forming a fourth photoresist layer over the substrate, wherein the fourth photoresist layer includes an opening that exposes the P-type active region and the fourth photoresist layer covers the N-type active region;

applying a third ion implantation of an N-type dopant using the fourth photoresist layer and the first polysilicon gate and the first and second spacers as an implant mask to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer;

stripping the fourth photoresist layer;

forming a fifth photoresist layer over the substrate, wherein the fifth photoresist layer includes an opening above the N-type active region and the fifth photoresist layer covers the P-type active region;

applying a second ion implantation of a P-type dopant using the fifth photoresist layer and the second polysilicon gate and the third and fourth spacers as an implant mask to convert a portion of the lightly doped P-type source region outside the third spacer into a heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer;

stripping the fifth photoresist layer;

forming an N-type source and drain in the P-type active region, wherein the N-type source includes the heavily doped and ultra-heavily doped N-type source regions, the N-type drain includes the lightly doped and heavily doped N-type drain regions, the N-type source provides a first channel junction, and the lightly doped N-type drain region provides a second channel junction; and forming a P-type source and drain in the N-type active region, wherein the P-type source includes the lightly doped and heavily doped P-type source regions, the P-type drain includes the lightly doped and heavily doped P-type drain regions, the lightly doped P-type source region provides a third channel junction, and the lightly doped P-type drain region provides a fourth channel junction.

\* \* \* \* \*